United States Patent
Honda

[11] Patent Number: 5,962,913
[45] Date of Patent: *Oct. 5, 1999

[54] BIPOLAR TRANSISTOR HAVING A PARTICULAR CONTACT STRUCTURE

[75] Inventor: Hiroki Honda, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/639,066

[22] Filed: Apr. 24, 1996

[30] Foreign Application Priority Data

Jan. 19, 1996  [JP]  Japan .................................. 8-007342

[51] Int. Cl.⁶ ...................... H01L 27/082; H01L 27/102
[52] U.S. Cl. ........................................ 257/587; 257/579
[58] Field of Search .................... 257/587, 592, 257/588, 580, 378, 370

[56] References Cited

U.S. PATENT DOCUMENTS

| | | | |
|---|---|---|---|
| 3,450,961 | 6/1969 | Tsai | 257/370 |
| 3,758,797 | 9/1973 | Peterson et al. | 257/565 |
| 4,536,945 | 8/1985 | Gray et al. | 257/378 |
| 4,780,427 | 10/1988 | Sakai et al. | 257/592 |
| 5,011,784 | 4/1991 | RatnaKuman | 257/370 |
| 5,151,765 | 9/1992 | Yamuchi | 257/592 |
| 5,229,663 | 7/1993 | Itoh et al. | 307/455 |
| 5,414,291 | 5/1995 | Miwa et al. | 257/378 |

FOREIGN PATENT DOCUMENTS

| | | | |
|---|---|---|---|
| 59-121864 | 7/1984 | Japan . | |
| 60-126864 | 7/1985 | Japan . | |
| 61-230354 | 10/1986 | Japan . | |
| 62-216365 | 9/1987 | Japan | 257/579 |

Primary Examiner—Wael Fahmy
Attorney, Agent, or Firm—McDermott, Will & Emory

[57] ABSTRACT

A base region and an emitter region are formed at a surface of an n-well region (collector region). A contact hole reaching a portion of the surface of the collector region is formed, a contact hole reaching a portion of the surface of the emitter region is formed, and a contact hole reaching a portion of the surface of the base region is formed. A collector electrode, an emitter electrode and a base electrode are formed in the contact holes, respectively. Assuming that L represents a longitudinal length of the contact hole accommodating the emitter electrode and S represents a width thereof perpendicular to the longitudinal direction, a value of L/S is 10 or more. Thereby, a collector resistance of a bipolar transistor can be reduced, and a manufacturing cost can be reduced.

20 Claims, 10 Drawing Sheets

BIPOLAR TRANSISTOR HAVING A PARTICULAR CONTACT STRUCTURE

BACKGROUND OF THE INVENTION

1. Field of the Invention

The present invention relates to a bipolar transistor and a semiconductor device having the same, and in particular to a bipolar transistor manufactured by a process, from which formation of a heavily doped buried diffusion layer is omitted, as well as a semiconductor device having the bipolar transistor.

2. Description of the Background Art

An example of a semiconductor device having a bipolar transistor in the prior art is shown in FIG. 14. The semiconductor device shown in FIG. 14 is disclosed at FIG. 1(d) in Japanese Patent Laying-Open No. 61-230354 (1986).

Referring to FIG. 14, a p-type semiconductor substrate 21 is provided at its main surface with an n-type epitaxial layer 23. $n^+$-buried diffusion layers 22a and 22b are selectively formed at the bottom of n-type epitaxial layer 23. An isolation region 24 and a p-well region 25 are formed at predetermined positions of n-type epitaxial layer 23.

Isolation oxide films 29 are selectively formed at the surface of n-type epitaxial layer 23. A base region 28, an external base region 28a, an emitter region 35 and an $n^+$-diffusion layer 26c are formed at the surface of n-type epitaxial layer (collector region) 23 located above $n^+$-buried diffusion layer 22a. In the state shown in FIG. 14, a polycrystalline silicon layer 33 is formed on base region 28 and emitter region 35.

A pMOS transistor is formed at the surface of n-type epitaxial layer 23 located above $n^+$-buried diffusion layer 22b. The pMOS transistor has a pair of $p^+$-diffusion layers 27a and 27b as well as a gate electrode 30b.

An nMOS transistor is formed at the surface of p-well region 25. The nMOS transistor has a pair of $n^+$-diffusion layers 26a and 26b as well as a gate electrode 30a. Gate electrodes 30a and 30b are covered with insulating layers 31, over which insulating layers 32 are formed. Insulating layers 32 are also formed over isolating oxide films 29.

In the above semiconductor device, $n^+$-buried diffusion layer 22a is formed for reducing a collector resistance, as shown in FIG. 14. Formation of $n^+$-buried diffusion layer 22a requires various steps such as a photolithographic step and an ion implanting step, resulting in remarkable increase of a manufacturing cost. Therefore, it is desired to eliminate formation of $n^+$-buried diffusion layer 22a for reducing the manufacturing cost. FIG. 15 shows an example of a bipolar transistor manufactured by a process, from which formation of the $n^+$-buried diffusion layer is omitted. This bipolar transistor is the same as that disclosed in Japanese Patent Laying-Open No. 59-121864 (1984).

Referring to FIG. 15, p-type semiconductor substrate 21 is provided at its main surface with an n-well region 34. p-type base region 28 is formed at the surface of n-well region 34. An emitter region 35 is formed at the surface of base region 28.

At the surface of n-well region 34, there is formed an $n^+$-diffusion layer 26c spaced from base region 28. $n^+$-diffusion layer 26c has a diffusion depth larger than that of emitter region 35 as shown in FIG. 15. Thereby, the collector resistance can be reduced.

$n^+$-diffusion layer 26c is formed at the same diffusion step as emitter region 35, and impurities introduced into $n^+$-diffusion layer 26c and emitter region 35 are selected so that the diffusion coefficient of impurity introduced into $n^+$-diffusion layer 26c is larger than that introduced into the emitter region 35. As described above, polycrystalline silicon layer 36 doped with impurity different from that introduced into emitter region 35 is formed on the surface of $n^+$-diffusion layer 26c.

An insulating layer 38 having openings at predetermined positions is formed on the main surface of semiconductor substrate 1. A collector electrode 37a, an emitter electrode 37b and a base electrode 37c are formed in these openings, respectively.

In the process of manufacturing the bipolar transistor shown in FIG. 15, formation of the $n^+$-buried diffusion layer is omitted, so that the manufacturing cost can be smaller than that of the structure shown in FIG. 14. Due to elimination of the $n^+$-buried diffusion layer, however, the collector resistance of the bipolar transistor shown in FIG. 15 is larger than that of the bipolar transistor shown in FIG. 14. Even the bipolar transistor having a relatively high collector resistance can be used in a circuit performing a small-amplitude operation. More specifically, a circuit such as a differential circuit in a sense amplifier of an SRAM (Static Random Access Memory) can use such a bipolar transistor having a relatively high collector resistance.

A structure and an operation of a differential circuit will be described below with reference to FIG. 16. FIG. 16 is an equivalent circuit diagram showing an example of the differential circuit. Referring to FIG. 16, a pair of npn transistors Q1 and Q2 are connected to have a common emitter. The emitter is connected to a constant current supply (500 $\mu$A) 20. Collectors of npn bipolar transistors Q1 and Q2 are connected to a power supply Vcc via resistances R1 and R2 each having a resistance of 600 $\Omega$, respectively. An input terminal Vin1 is connected to a base of npn bipolar transistor Q1. An input terminal Vin2 is connected to a base of npn bipolar transistor Q2. Output terminals Vout1 and Vout2 are connected to collectors of npn bipolar transistors Q1 and Q2, respectively. Output terminals Vout1 and Vout2 are grounded via capacitors C1 and C2 each having a capacitance of 0.5 pF, respectively.

In the above differential circuit, when a voltage applied to input terminal Vin1 is higher than a voltage applied to input terminal Vin2, a current flows through bipolar transistor Q1. Thereby, the potential on output terminal Vout1 is lower than that on output terminal Vout2. When the voltage applied to input terminal Vin1 is lower than the voltage applied to input terminal Vin2, the potential on output terminal Vout1 is higher than that on output terminal Vout2.

It is considered that the bipolar transistor shown in FIG. 15 can be used in the differential circuit having the structure and operation described above. However, the following point must be taken into consideration when using the bipolar transistor.

FIG. 17 shows a relationship between a current amplification efficiency ($h_{FE}$) and a collector current (Ic). When using the bipolar transistor in the differential circuit shown in FIG. 16, it is desired that collector current Ic is about 500 $\mu$A. In order to obtain the stable value of $h_{FE}$ with collector current Ic of the above value, a collector resistance Rc must be 250 $\Omega$ or less as shown in FIG. 17. If collector resistance Rc is larger than 250 $\Omega$, the stable value of $h_{FE}$ cannot be obtained with collector current Ic of 500 $\mu$A.

Meanwhile, collector resistance Rc can be reduced in the bipolar transistor shown in FIG. 15 by forming deep $n^+$-diffusion layer 26c as already described. This enables use in the differential circuit shown in FIG. 16.

However, even the bipolar transistor shown in FIG. 15 suffers from the following problem. In the bipolar transistor shown in FIG. 15, impurity for forming emitter region 35 must be different from that for forming n$^+$-diffusion layer 26c. Therefore, formation of n$^+$-diffusion layer 26c requires a step of newly forming polycrystalline silicon layer 36 doped with impurity which is different from that used for forming emitter region 35. This results in a complicated manufacturing process and thus a high manufacturing cost.

SUMMARY OF THE INVENTION

The invention has been developed for overcoming the above problems. An object of the invention is to provide a bipolar transistor, in which a heavily doped buried diffusion layer is not formed, as well as a semiconductor device having the bipolar transistor, and more specifically to reduce a collector resistance and a manufacturing cost of the same.

According to an aspect of the invention, a bipolar transistor includes a semiconductor substrate of a first conductivity type having a main surface, a collector region of a second conductivity type, a base region of the first conductivity type, an emitter region of the second conductivity type, an insulating layer, a collector electrode, an emitter electrode and a base electrode. The collector region is formed at the main surface of the semiconductor substrate. The base region is formed at the surface of the collector region. The emitter region is formed at the surface of the base region. The insulating layer is formed on the main surface of the semiconductor substrate, and has first, second and third openings reaching portions of the surfaces of the collector region, emitter region and base region, respectively. The collector electrode, emitter electrode and base electrode are formed in the first, second and third openings, respectively. A concentration of impurity of the second conductivity type contained in the collector region located immediately under the base region is 5×10$^{18}$ cm$^{-3}$ or less. L representing a longitudinal length of the second opening and S representing a width of the second opening in a direction perpendicular to the longitudinal direction satisfy a relationship that a value of L/S is 10 or more.

According to the above aspect, as described above, the length L and the width S of the second opening are determined so that the length L of the second opening is ten or more times as large as the width S thereof. It can be considered from the relationship shown in FIGS. 5 and 6 that the collector resistance Rc significantly depends on the length L and the width S. Accordingly, the inventors paid attention to the value of L/S, and prepared a graph showing change in a value of the collector resistance Rc as a function of the value L/S. As a result, a relationship shown in FIG. 7 was obtained. As shown in FIG. 7, the value L/S of 10 or more can reduce the collector resistance Rc to 250 Ω or less. Thereby, the bipolar transistor of this aspect can be used in the differential circuit shown in FIG. 16. Since it is required only to change the configuration of the second opening, it is not necessary to add a new step, which is required for the bipolar transistor shown in FIG. 15. Therefore, the manufacturing process can be more simple than the case shown in FIG. 15, and thus the manufacturing cost can be reduced.

According to another aspect of the invention, a bipolar transistor includes a semiconductor substrate of a first conductivity type having a main surface, a collector region of a second conductivity type, a base region of the first conductivity type, first and second emitter regions of the second conductivity type, an insulating layer, a base electrode, first and second emitter electrodes, and first and second collector electrodes. The collector region is formed at the main surface of the semiconductor substrate. The base region is formed at the surface of the collector region. The first and second emitter regions are formed at the surface of the base region with a space from each other. The insulating layer is formed on the main surface of the semiconductor substrate, and has a first opening reaching a portion of the surface of the base region, second and third openings spaced from each other with the first opening therebetween and reaching portions of the surfaces of the first and second emitter regions, respectively, and fourth and fifth openings spaced from each other with the second and third openings therebetween and reaching portions of the surface of the collector region. The base electrode is formed in the first opening. The first and second emitter electrodes are formed in the second and third openings, respectively. The first and second collector electrodes are formed in the fourth and fifth openings, respectively. A concentration of impurity of the second conductivity type contained in the collector region located immediately under the base region is 5×10$^{18}$ cm$^{-3}$ or less. L1 and S1 representing a longitudinal length of the second opening and a width of the same in a direction perpendicular to the longitudinal direction, respectively, and L2 and S2 representing a longitudinal length of the third opening and a width of the same in a direction perpendicular to the longitudinal direction, respectively, satisfy a relationship that (L1/S1)+(L2/S2) is 10 or more.

According to the above aspect, as described above, the second and third openings are formed on the first and second emitter regions, and first and second emitter electrodes are formed in the second and third openings. Assuming that L1 and S1 represent the length and width of the second opening, respectively, and that L2 and S2 represent the length and width of the third opening, respectively, the values of the lengths L2 and L2 and the widths of S1 and S2 of the second and third openings are determined to satisfy the relationship that the value of (L1/S1)+(L2/S2) is 10 or more. The reason for this is as follows. Since there are provided the first and second emitter regions, it can be considered that the collector resistance Rc is divided into Rc1 and Rc2, that 1/Rc is represented by (1/Rc1)+(1/Rc2), and that (1/Rc1)+(1/Rc2) is in proportion to (L1/S1)+(L2/S2) based on a principle similar to that of the first aspect already described. By defining L1, L2, S1 and S2 in this manner, the collector resistance can be reduced similarly to the first aspect already described. Also in this aspect, it is not necessary to add a new step, which is similar to the first aspect. Therefore, the manufacturing cost can be lower than that in the case shown in FIG. 15. Further, in this aspect, the emitter regions are arranged in a divided form and located at opposite sides of the base region. Therefore, the bipolar transistor can have a planar configuration similar to a square compared with the first aspect. This can increase a degree of freedom of layout of the bipolar transistors, and can reduce an area of the bipolar transistors.

According to still another aspect of the invention, a bipolar transistor includes a semiconductor substrate of a first conductivity type having a main surface, a collector region of a second conductivity type, first and second base regions of the first conductivity type, first and second emitter regions of the second conductivity type, an insulating layer, a collector electrode, first and second emitter electrodes, and first and second base electrodes. The collector region is formed at the main surface of the semiconductor substrate. The first and second base regions are formed at the surface of the collector region. The first and second emitter regions are formed at the surfaces of the first and second base regions, respectively. The insulating layer is formed on the main surface of the semiconductor substrate, and has a first opening reaching a portion of the surface of the collector region, second and third openings spaced from each other with the first opening therebetween and reaching portions of the surfaces of the first and second emitter regions, respectively, and fourth and fifth openings spaced from each other with the second and third openings therebetween and reaching portions of the surfaces of the first and second base regions, respectively. The collector electrode is formed in the first opening. The first and second emitter electrodes are formed in the second and third openings, respectively. The first and second base electrodes are formed in the fourth and fifth openings, respectively. A concentration of impurity of the second conductivity type contained in the collector region located immediately under the base region is $5 \times 10^{18} \text{cm}^{-3}$ or less. L1 and S1 representing a longitudinal length of the second opening and a width of the same in a direction perpendicular to the longitudinal direction, respectively, and L2 and S2 representing a longitudinal length of the third opening and a width of the same in a direction perpendicular to the longitudinal direction, respectively, satisfy a relationship that (L1/S1)+(L2/S2) is 10 or more.

According to the bipolar transistor of the above aspect, the collector resistance can be reduced, as can be done in the foregoing another aspect. Also, similarly to another aspect, the manufacturing cost can be reduced, and the degree of freedom of layout can be increased.

A semiconductor device having a bipolar transistor according to the invention includes a semiconductor substrate of a first conductivity type having a main surface, a well region of a second conductivity type, an MOS transistor, a collector region of the second conductivity type, a base region of the first conductivity type, an emitter region of the second conductivity type, an insulating layer, a collector electrode, an emitter electrode and a base electrode. The well region is formed at the main surface of the semiconductor substrate. The MOS transistor is formed on the surface of the well region, and has source/drain regions of the first conductivity type. The collector region is spaced from the well region and is formed at the main surface of the semiconductor substrate. The base region is formed at the surface of the collector region. The emitter region is formed at the surface of the base region. The insulating layer is formed on the main surface of the semiconductor substrate, and has first, second and third openings reaching portions of the surfaces of the collector region, emitter region and base region, respectively. The collector electrode, emitter electrode and base electrode are formed in the first, second and third openings, respectively. A concentration of impurity of the second conductivity type contained in the collector region located immediately under the base region is substantially equal to a concentration of impurity of the second conductivity type contained in the well region. L representing a longitudinal length of the second opening and S representing a width of the second opening in a direction perpendicular to the longitudinal direction satisfy a relationship that a value of L/S is 10 or more.

By determining the length L and the width S of the second opening to satisfy the relationship that the value of L/S is 10 or more, as described above, the collector resistance of the bipolar transistor can be reduced, as can be done in the bipolar transistor of the first aspect already described. Also, the manufacturing cost can be reduced, as can be done in the bipolar transistor of the first aspect already described. Since the concentration of impurity of the second conductivity type contained in the collector region located immediately under the base region is substantially equal to that of impurity of the second conductivity type contained in the well region, these can be formed at the same step. Therefore, the manufacturing cost can be further reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to FIGS. 1 to 13.
(Embodiment 1)

Figure 1:
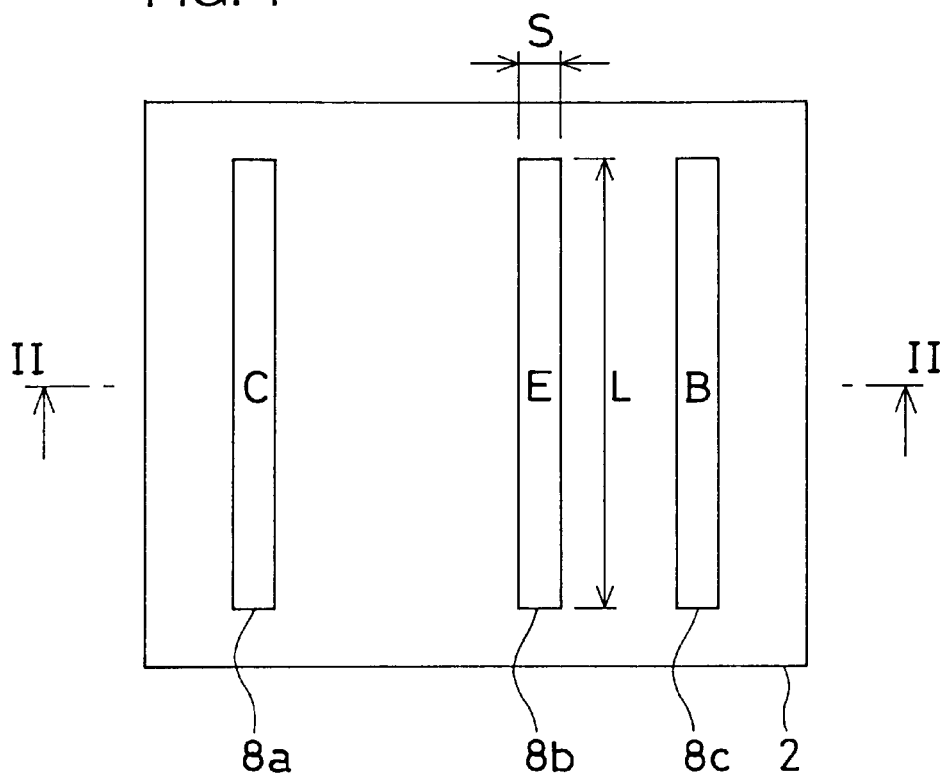
FIG. 1 is a plane showing a bipolar transistor of an embodiment 1 of the invention.
Figure 2:
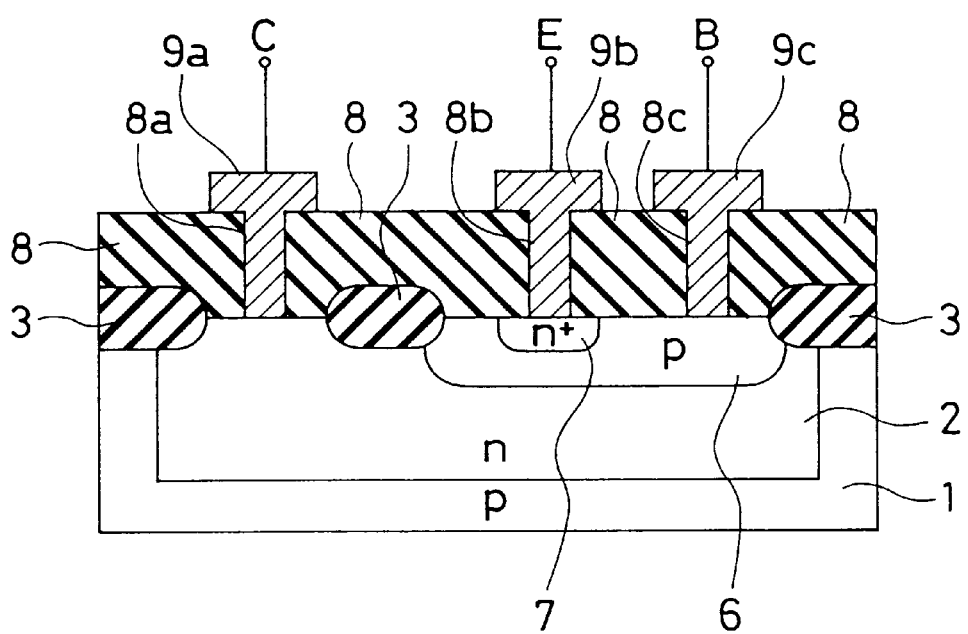
FIG. 2 is a cross section taken along line II—II in FIG. 1.

Referring to FIGS. 1 to 10, description will be given on a bipolar transistor and a semiconductor device having the same of an embodiment 1 of the invention as well as its modification. FIG. 1 is a plane showing a bipolar transistor of the embodiment 1 of the invention. In FIG. 1, electrodes are not shown. FIG. 2 is a cross section taken along line II—II in FIG. 1.

Figure 14:
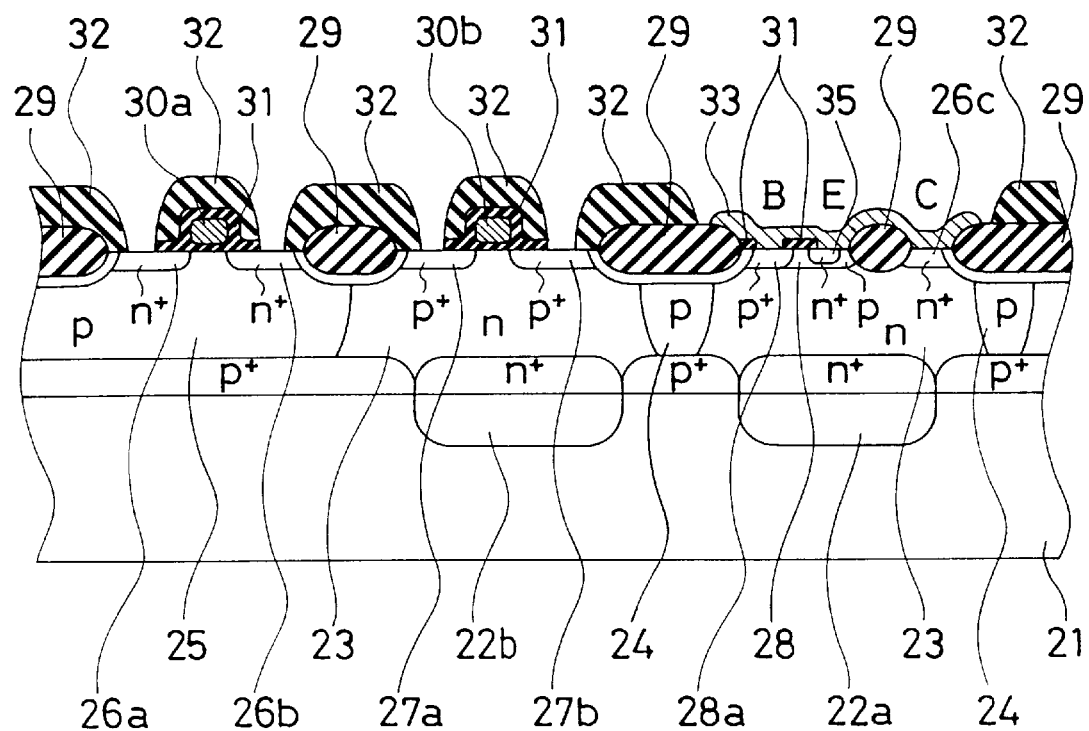
FIG. 14 is a cross section showing an example of a semiconductor device having a bipolar transistor in the prior art.

Referring to FIG. 2, a p-type semiconductor substrate 1 is provided at its main surface with an n-well region 2. A concentration of n-type impurity contained in n-well region 2 is $5 \times 10^{18} \text{cm}^{-3}$ or less. Thus, n-well region 2 is not provided with n$^+$-buried diffusion layer 22a which is employed in the prior art shown in FIG. 14. n-well region 2 forms a collector region of the bipolar transistor of the embodiment 1.

p-type base region 6 is formed at the surface of n-well region 2. n-type emitter region 7 is formed at the surface of base region 6. Isolating oxide films 3 are selectively formed at the main surface of p-type semiconductor substrate 1. Isolating oxide films 3 are covered with an interlayer insulating layer 8 formed on the main surface of semiconductor substrate 1. Interlayer insulating layer 8 is provided with a contact hole 8a reaching a portion of the surface of n-well region 2, a contact hole 8b reaching a portion of the surface of emitter region 7, and a contact hole 8c reaching a portion of the surface of base region 6. A collector electrode 9a, an emitter electrode 9b and a base electrode 9c, which are made of, e.g., metal such as aluminum, are formed in contact holes 8a, 8b and 8c, respectively.

Referring to FIG. 1, contact holes 8a, 8b and 8c are preferably arranged parallel to each other so that they extend in the same direction. In this invention, a planar configuration of contact hole 8b accommodating emitter electrode 9b is devised. Specifically, attention was paid to a relationship between a longitudinal length L and a width S in a direction perpendicular to the longitudinal direction of contact hole 8b, and this relationship was studied. As a result, the inventors have found that, when the value L/S is 10 or more, the collector resistance can be restricted to or below an intended value (250 Ω in this case).

The grounds for determining the value of L/S as described above and the effect achieved thereby will now be described below in detail. The following description will be given on the assumption that emitter region 7 having a predetermined width is formed immediately under the contact hole 8b.

Figure 3:
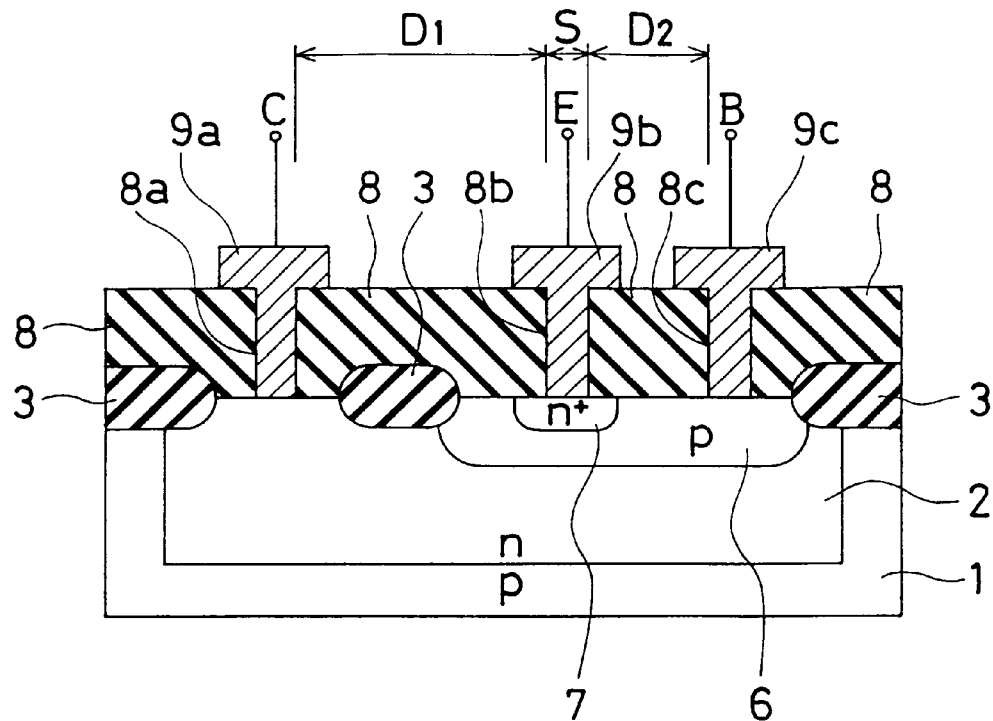
FIG. 3 shows conditions for obtaining data shown in FIG. 5.
Figure 5:
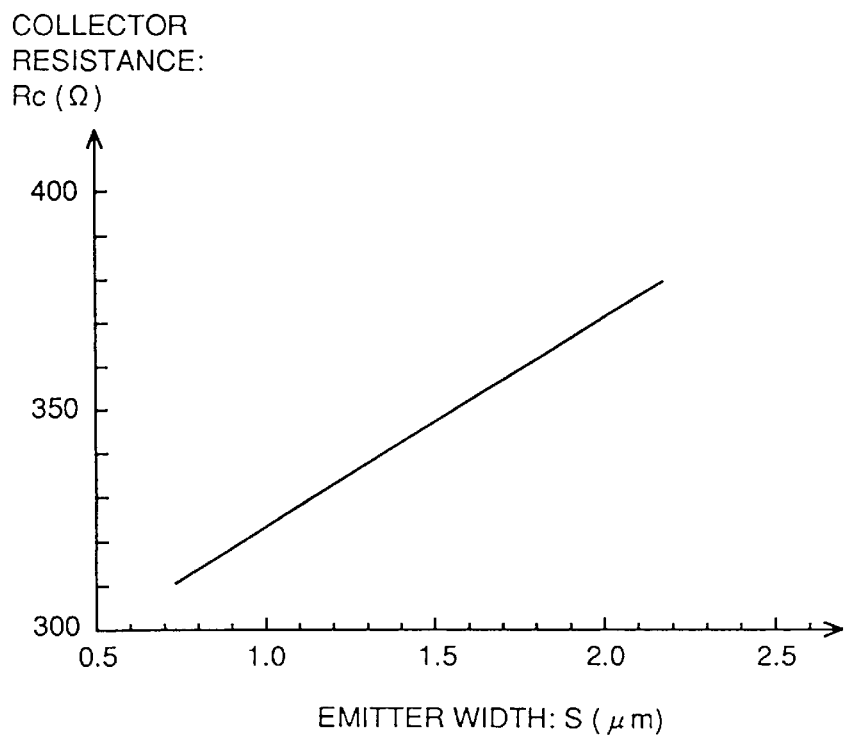
FIG. 5 is a graph showing a relationship between a collector resistance Rc (Ω) and an emitter width S (μm)

Referring to FIG. 3, a distance D1 between contact holes 8a and 8b as well as a distance D2 between contact holes 8b and 8c were maintained at constant values, and change in the value of collector resistance Rc as a function of width S of contact hole 8b was determined. The result is shown in FIG. 5. FIG. 5 shows data in the case where emitter length L is 6 μm. As shown in FIG. 5, collector resistance Rc can be reduced by reducing emitter width S.

Figure 4:
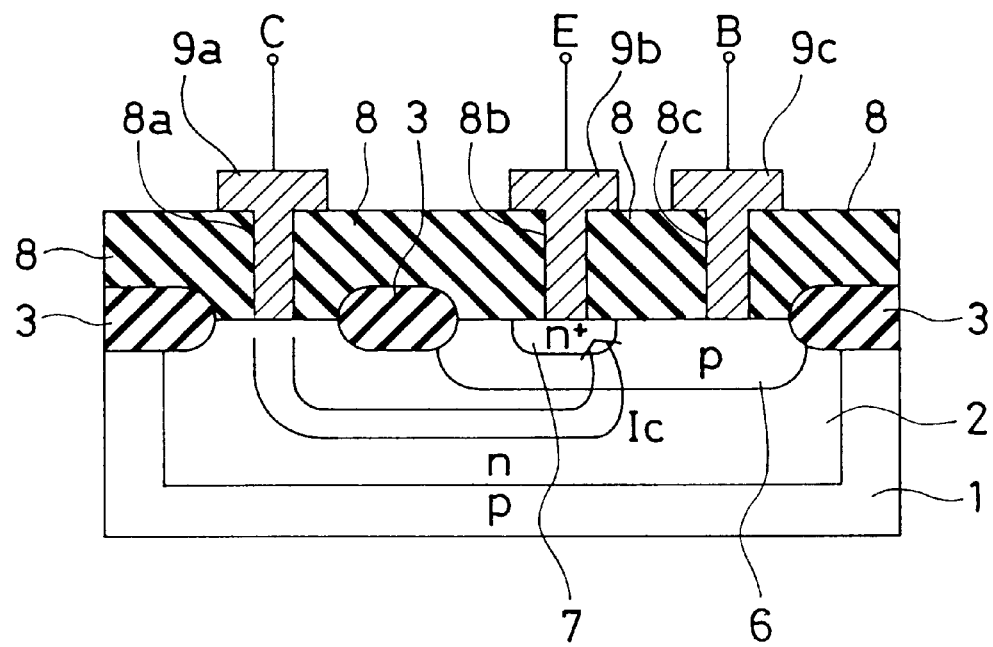
FIG. 4 is a cross section showing a path of flow of a collector current Ic.

Referring again to FIG. 3, when width S changes while maintaining distances D1 and D2 at constant values, it is an end of emitter region 7 near base electrode 9c that changes in emitter region 7 viewed from collector electrode 9a. As the value of width S decreases, the end of emitter region 7 near the base electrode 9c moves toward collector electrode 9a. It can be considered that this phenomenon reduces the collector resistance. Thus, it is considered that collector current Ic increases owing to the fact that the end of emitter region 7 near base electrode 9c moves toward collector electrode 9a. From this, it is considered that collector current Ic mainly flows into the end of emitter region 7 located near base electrode 9c, as shown in FIG. 4.

Figure 6:
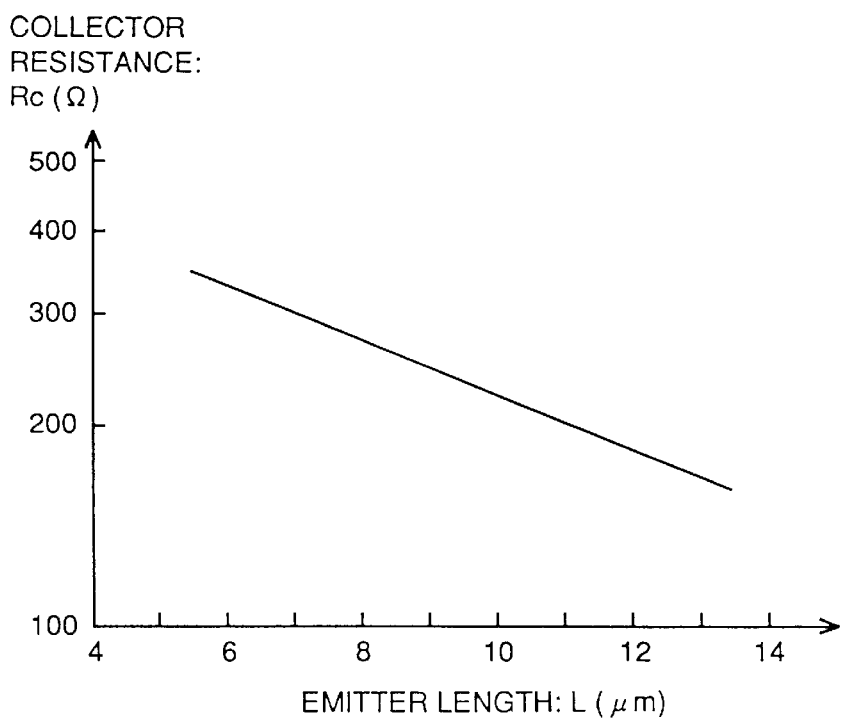
FIG. 6 is a graph showing a relationship between a collector resistance Rc (Ω) and an emitter length L (μm)
Figure 7:
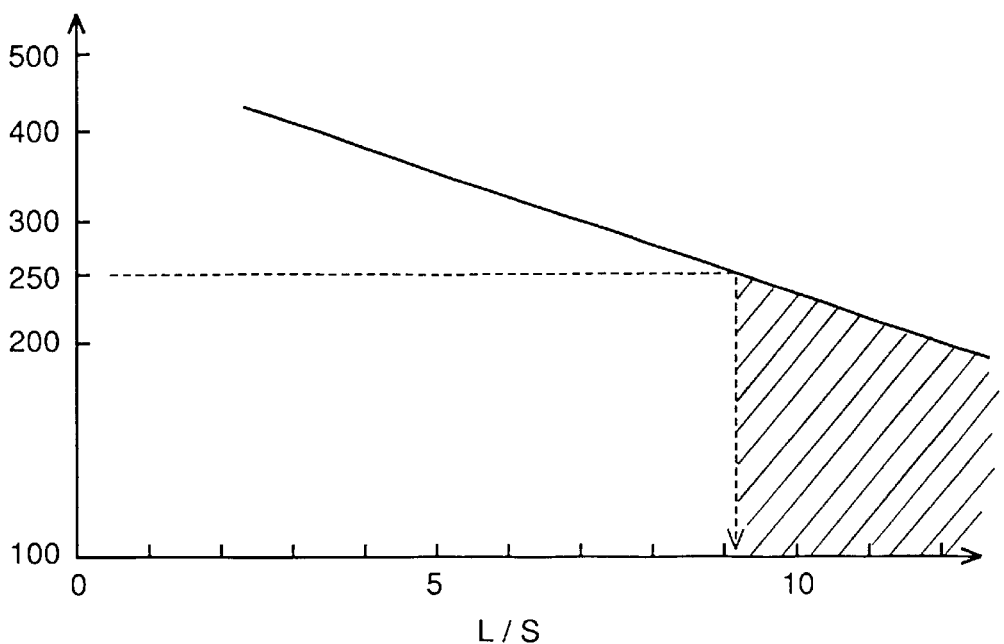
FIG. 7 is a graph showing a relationship between a collector resistance Rc (Ω) and L/S.
Figure 16:
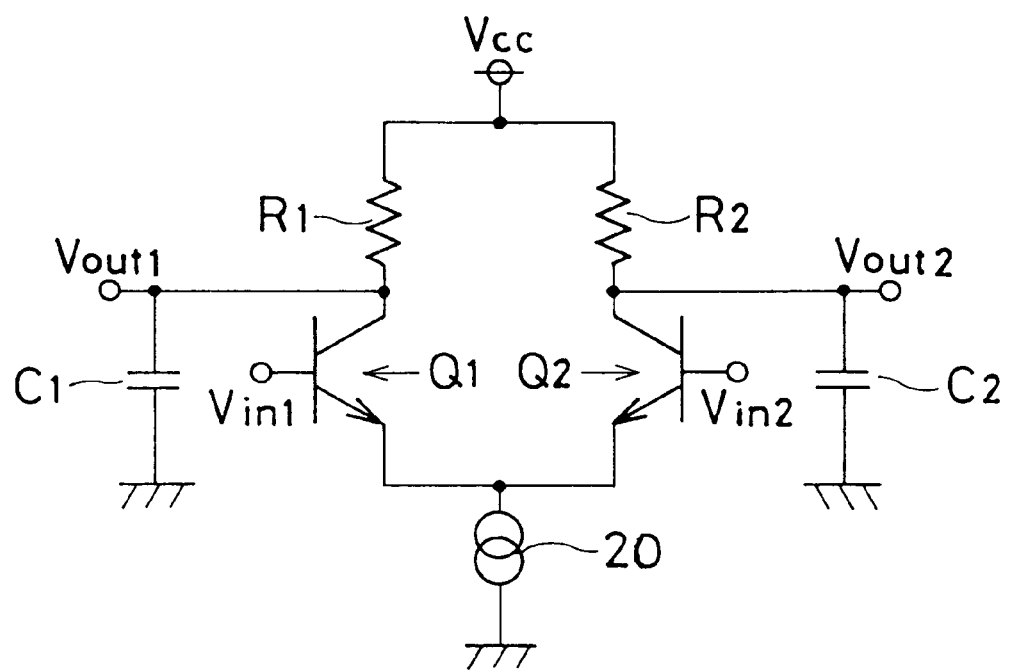
FIG. 16 is an equivalent circuit diagram showing an example of a differential circuit.
Figure 17:
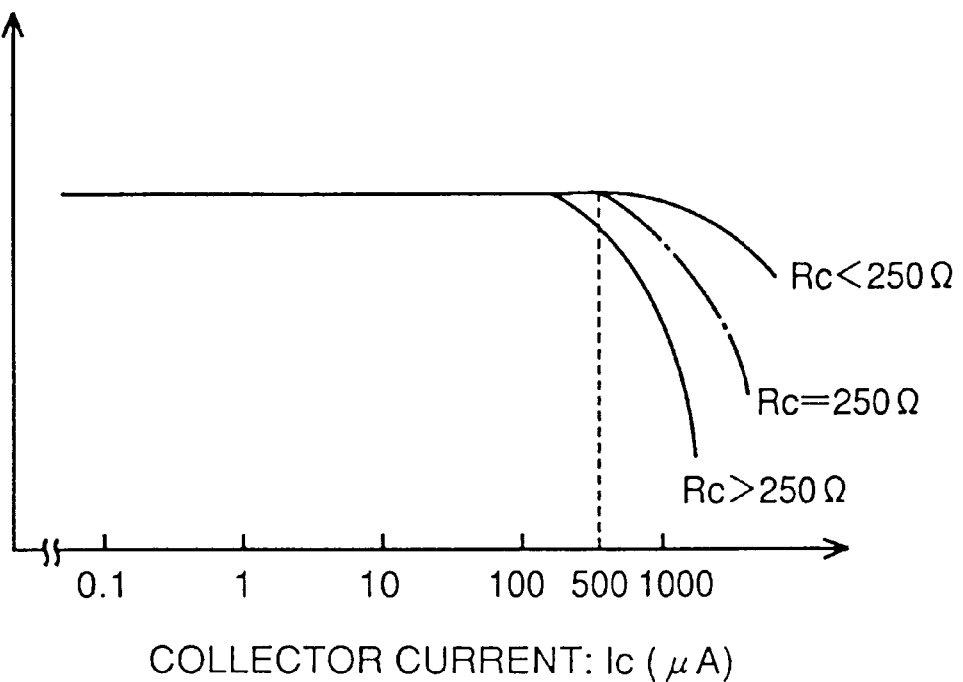
FIG. 17 is a graph showing a relationship between a current amplification factor $h_{FE}$ and a collector current Ic (μA).

Referring to FIG. 6, description will be given on a relationship between emitter length L and collector resistance Rc. FIG. 6 shows data in the case where emitter width S is 1 μm. As shown in FIG. 6, it can be understood that collector resistance Rc decreases in accordance with increase of emitter length L. From these contents and the result shown in FIG. 5, it can be considered that collector resistance Rc significantly depends on S/L. Meanwhile, the inventors paid attention to L/S as a parameter, and prepared a graph by determining a relationship between L/S and the collector resistance. This graph is shown in FIG. 7. As shown in FIG. 7, it can be understood that the value of L/S of 10 or more can set the collector resistance to or below 250 Ω so as to allow use of a bipolar transistor in the differential circuit shown in FIG. 16. Based on this, the inventors restrict the value of L/S to 10 or more.

Figure 15:
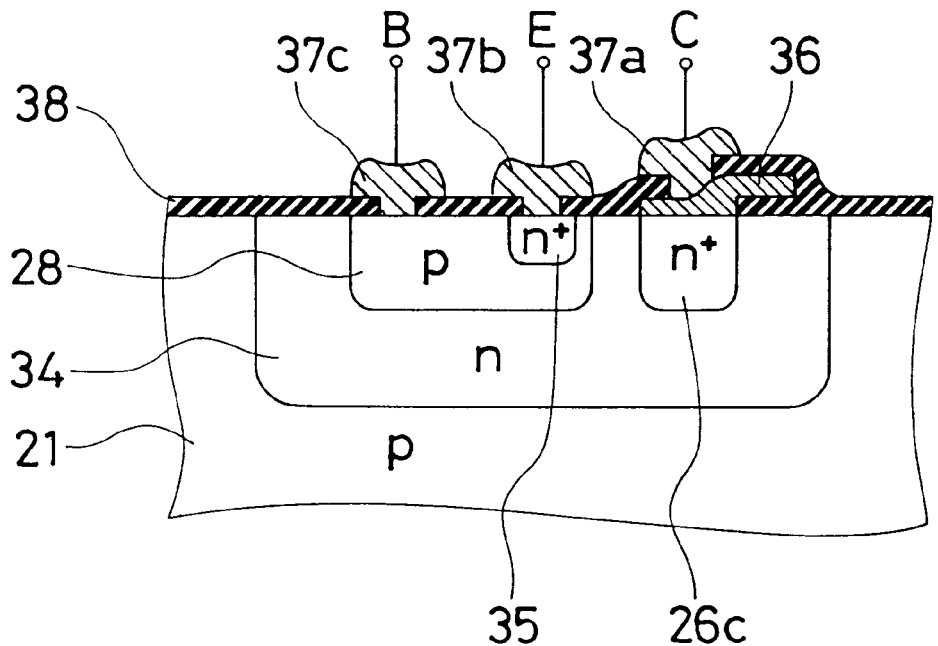
FIG. 15 is a cross section showing another example of a bipolar transistor in the prior art.

As described above, the value of L/S of 10 or more can reduce collector resistance Rc to or below 250 Ω (for example, in the case of S is 0.7 μm and L is 8.8 μm, L/S is 12.6 and Rc is 200 Ω), so that the bipolar transistor which operates appropriately in the foregoing differential circuit can be obtained. The above contents can be implemented only by changing the configuration of contact hole 8b, and thus the implementation does not require an additional step. Thereby, it is possible to overcome the problem of increased manufacturing cost, which arises in the prior art shown in FIG. 15.

Figure 8:
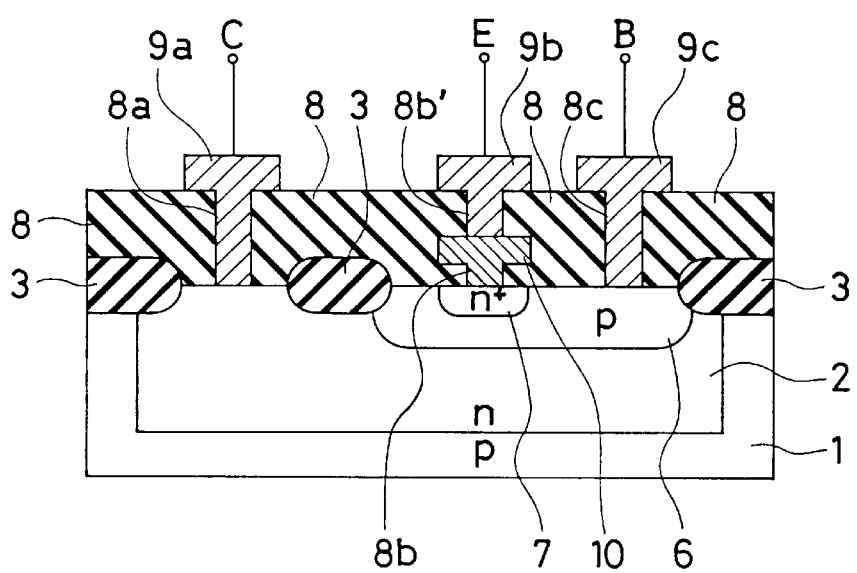
FIG. 8 is a cross section showing a bipolar transistor of a modification of the embodiment 1.

A modification of the bipolar transistor shown in FIG. 2 will be described below with reference to FIG. 8. FIG. 8 is a cross section showing a modification of the bipolar transistor shown in FIG. 2.

Referring to FIG. 8, this modification includes a pad conductive layer 10 between emitter region 7 and emitter electrode 9b. The pad conductive layer 10 may be made of polycrystalline silicon or polycide. Owing to provision of pad conductive layer 10, emitter region 7 can be formed by diffusing impurity from pad conductive layer 10. Thereby, generation of defects at the surface of emitter region 7 can be suppressed more effectively than the case where emitter region 7 is formed by ion implantation.

In this modification, pad conductive layer 10 is located in contact hole 8b, and emitter electrode 9b is formed in a contact hole 8b'.

Figures 9A, 9B:
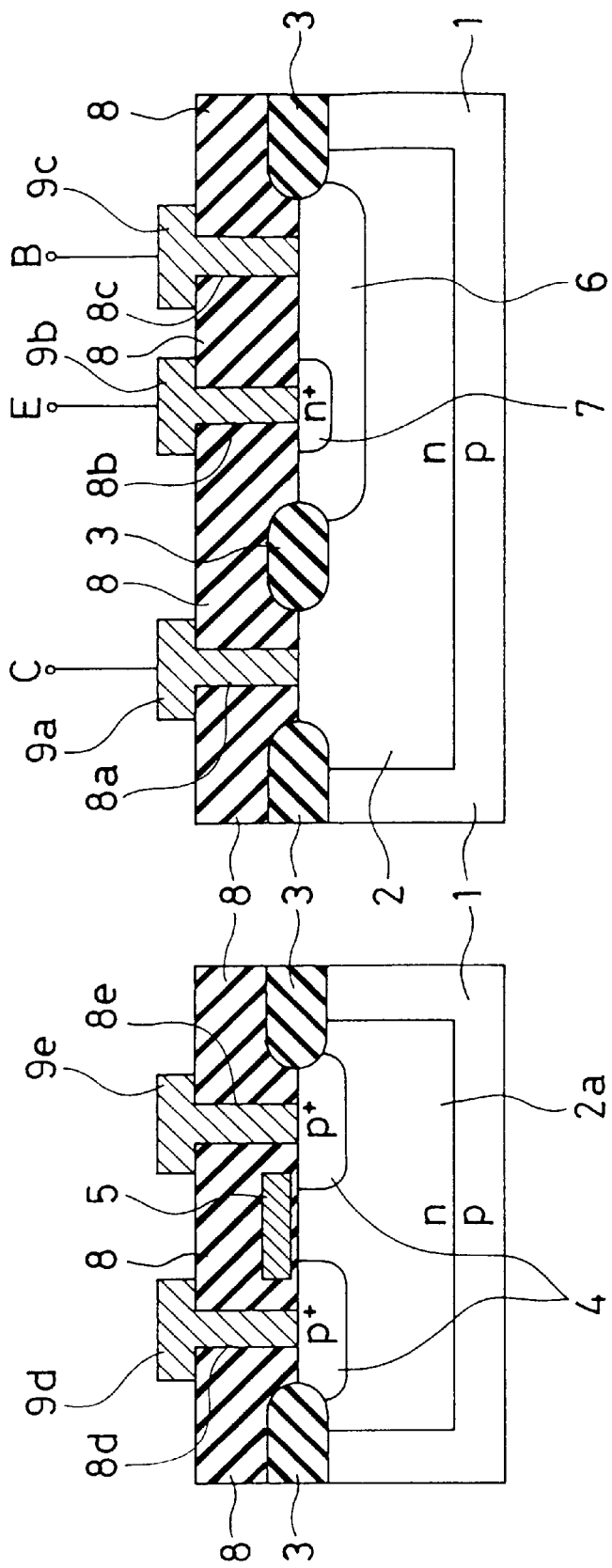
FIGS. 9A and 9B are fragmentary cross sections showing a semiconductor device having a pMOS transistor and a bipolar transistor of the invention on the same semiconductor substrate, and more specifically show the pMOS transistor and the bipolar transistor, respectively.

Referring to FIGS. 9A and 9B, description will be given on a structure where a pMOS transistor and the bipolar transistor according to the invention are formed on the same substrate. FIGS. 9A and 9B are fragmentary cross sections showing the semiconductor device which has the bipolar transistor according to the invention and the pMOS transistor on the same substrate.

Referring to FIGS. 9A and 9B, the semiconductor substrate 1 is provided at the main surface with an n-well region 2a spaced from n-well region 2. It is preferable that concentrations of n-type impurity contained in n-well regions 2 and 2a are substantially equal to each other. This enables formation of n-well regions 2 and 2a at the same step. As a result, the manufacturing process can be simplified, and the manufacturing cost can be reduced.

The pMOS transistor is formed at the surface of n-well region 2a. The pMOS transistor includes a pair of p$^+$-diffusion layers 4 and a gate electrode 5. Gate electrode 5 is covered with interlayer insulating layer 8, which is provided with contact holes 8d and 8e. Electrodes 9d and 9e containing metal such as aluminum are formed in contact holes 8d and 8e, respectively.

Figures 10A, 10B:
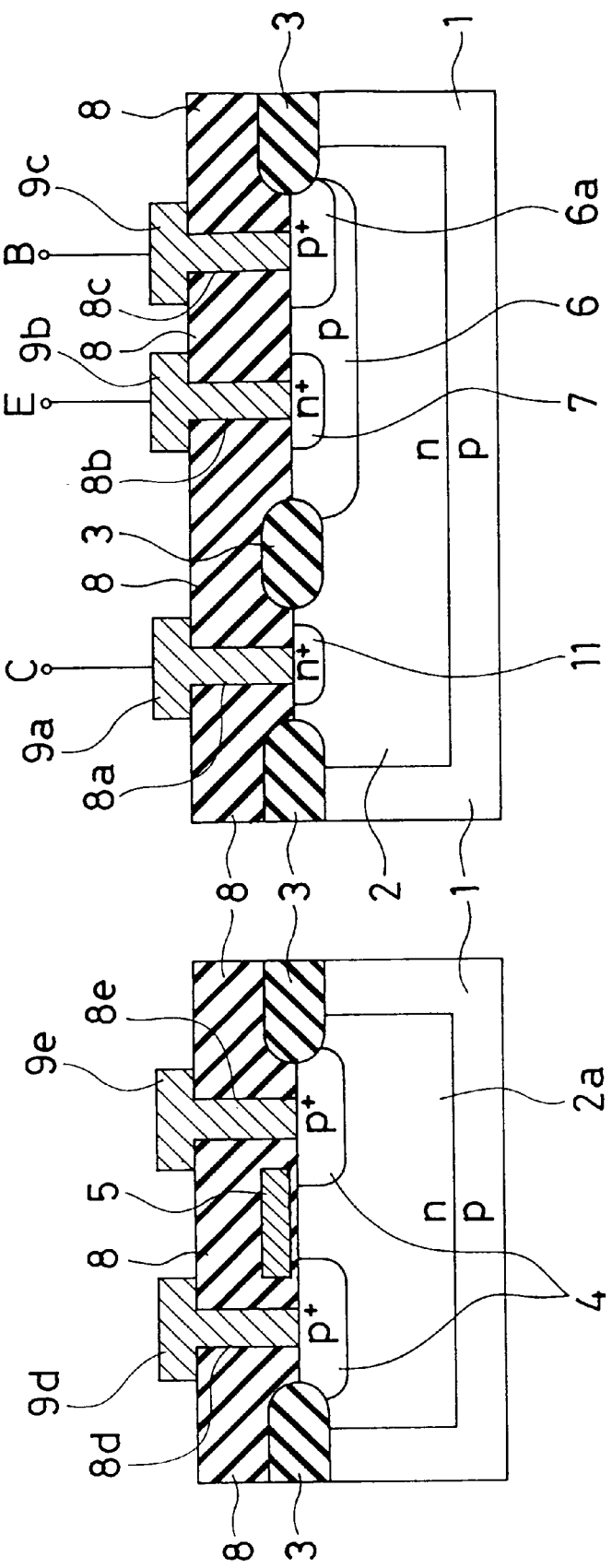
FIGS. 10A and 10B are cross sections of a semiconductor device which is a modification of the semiconductor device shown in FIGS. 9A and 9B, and more specifically show a pMOS transistor and a bipolar transistor, respectively.

Referring to FIGS. 10A and 10B, a modification of the semiconductor device shown in FIGS. 9A and 9B will be described below. FIGS. 10A and 10B are cross sections showing a semiconductor device which is the modification of the semiconductor device shown in FIGS. 9A and 9B.

In this modification, an n$^+$-diffusion region 11 is formed at a contact portion between collector electrode 9a and n-well region 2, and base region 6 has an external base region 6a, as shown in FIGS. 10A and 10B. Structures other than the above are similar to those of the semiconductor device shown in FIGS. 9A and 9B.

Owing to formation of n$^+$-diffusion layer 11 in this modification, the contact resistance between n-well region 2 and collector electrode 9a can be lower than that in the case shown in FIGS. 9A and 9B. Further, owing to formation of external base region 6a, the contact resistance between base electrode 9c and base region 6 can be lower than that in the case shown in FIGS. 9A and 9B.

In the structure shown in FIGS. 10A and 10B, n$^+$-diffusion layer 11 can be formed at the same step as emitter region 7, and external base region 6a can be formed at the same step as source/drain regions (p$^+$-diffusion layer 4) of the pMOS transistor. Therefore, addition of a new step is not required. Since n$^+$-diffusion layer 11 and emitter region 7 are formed at the same step as described above, the concentration of n-type impurity contained in n$^+$-diffusion layer 11 and the diffusion depth of n$^+$-diffusion layer 11 are equal to those of emitter region 7. The diffusion depth of external base region 6a and the concentration of p-type impurity contained in external base region 6a are equal to those of p$^+$-diffusion layer 4 in the pMOS transistor.

(Embodiment 2)

Figure 11:
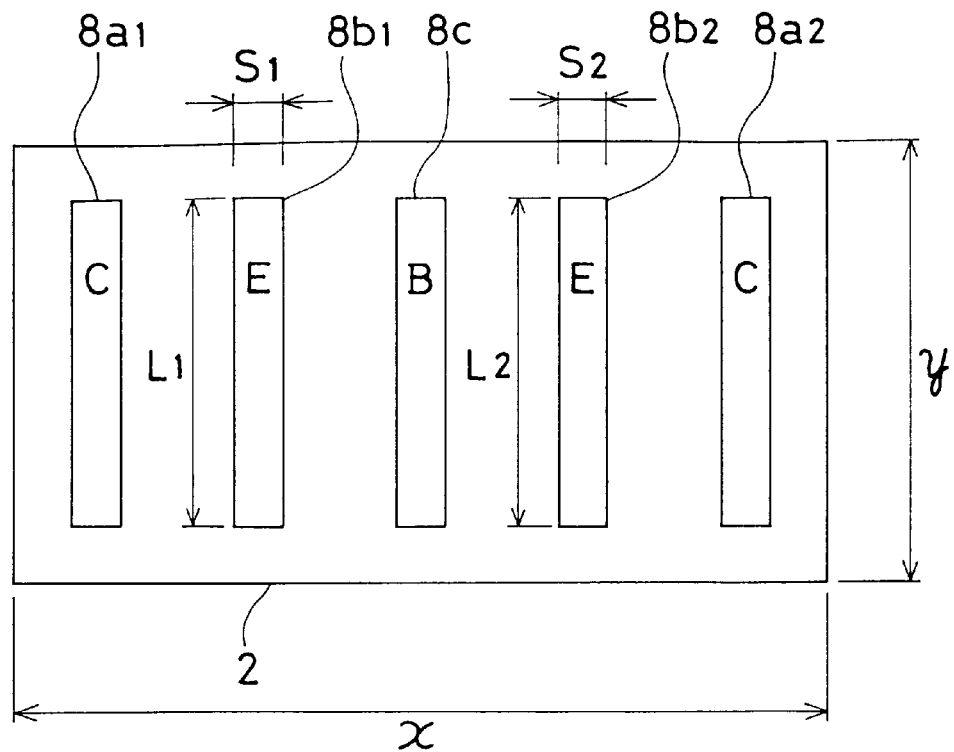
FIG. 11 is a plane showing a bipolar transistor of an embodiment 2 of the invention.
Figure 12:
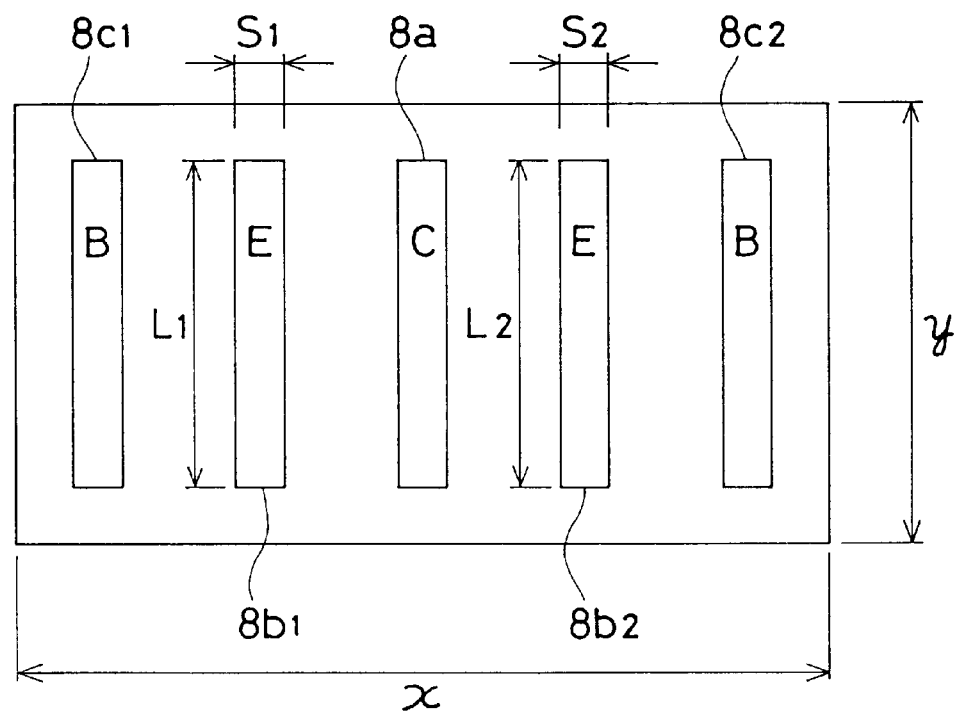
FIG. 12 is a plane showing a bipolar transistor which is a modification of the bipolar transistor shown in FIG. 11.
Figure 13:
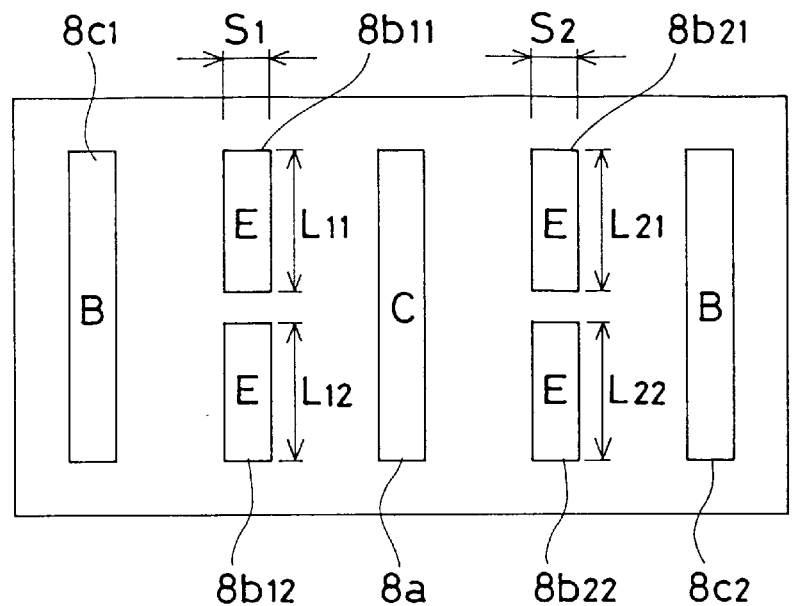
FIG. 13 is a plane showing a bipolar transistor which is a modification of the bipolar transistor shown in FIG. 12.

Referring to FIGS. 11 to 13, an embodiment 2 of the invention and a modification thereof will be described below. FIG. 11 is a plane showing a bipolar transistor of the embodiment 2 of the invention.

In the embodiment 2, contact holes 8b1 and 8b2 which are spaced from each other are located at opposite sides of contact hole 8c in which the base electrode is formed, as shown in FIG. 11. Emitter electrodes are formed in contact holes 8b1 and 8b2. Contact holes 8a1 and 8a2 which are spaced from each other are formed at opposite sides of an area including contact holes 8b1 and 8b2. Collector electrodes are formed in contact holes 8a1 and 8a2.

In the above structure, contact holes 8b1 and 8b2 have longitudinal lengths of L1 and L2 and widths of S1 and S2, respectively, as shown in FIG. 11, in which case the following relationship is required.

$$(L1/S1)+(L2/S2) \geq 10$$

The grounds for the above relationship will be described below. Since the emitter electrodes are arranged at two positions as shown in FIG. 11, it can be considered that collector resistance Rc of the bipolar transistor is divided. It is assumed that a collector resistance Rc1 exists between the emitter electrode formed in contact hole 8b1 and the collector electrode formed in contact hole 8a1, and that a collector resistance Rc2 exists between the emitter electrode formed in contact hole 8b2 and the collector electrode formed in contact hole 8a2. From this, the following relationship is obtained.

$$1/Rc = (1/Rc1) + (1/Rc2)$$

By further considering the foregoing similarly to the case of the embodiment 1, the following relationship is obtained.

$$1/Rc = (1/Rc1) + (1/Rc2) \; (L1/S1) + (L2/S2)$$

From the above formula, such a fact can be derived that the required value of (L1/S1)+(L2/S2) is 10 or more. Owing to this relationship, the bipolar transistor having collector resistance Rc of 250 Ω or less is obtained similarly to the embodiment 1.

Then, a planar configuration of the bipolar transistor will be described below. In the bipolar transistor of the embodiment 1, the value of L/S must be 10 or more, so that the bipolar transistor has an elongated planar configuration. This may reduce a degree of freedom of layout.

Meanwhile, the bipolar transistor of the embodiment 2 is provided with the divided contact holes for the emitter electrodes, so that the bipolar transistor can have a planar configuration similar to a square compared with that of the embodiment 1. This attains a higher degree of freedom than the embodiment 1. Owing to the planar configuration similar to a square, it is possible to reduce an area of the bipolar transistor.

Specific sizes of the bipolar transistor shown in FIG. 11 will be described below. L1 and L2 are about 6 μm, and S1 and S2 are 1 μm. In this case, a value of x in FIG. 11 is 14.3 μm, and a value of y is 11.4 μm. An area of the bipolar transistor is 163.02 μm$^2$.

If the same conditions are applied to the embodiment 1, L in FIG. 1 goes to 12 μm, and S goes to 1 μm. In this case, a value corresponding to x in FIG. 11 goes to 9.8 μm, and a value corresponding to y goes to 17.4 μm. As a result, an area of the bipolar transistor goes to 170.52 μm$^2$. From the foregoing, it can be understood that the structure shown in FIG. 11 can increase the degree of freedom of layout and can also reduce the area of the bipolar transistor.

Referring to FIG. 12, a modification of the bipolar transistor shown in FIG. 11 will be described below. FIG. 12 is a plane showing a modification of the bipolar transistor shown in FIG. 11.

In this modification, as shown in FIG. 12, contact hole 8a for forming the collector electrode is formed between contact holes 8b1 and 8b2 for forming the emitter electrodes, and contact holes 8c1 and 8c2 for forming the base electrodes are formed at opposite sides of an area including contact holes 8b1 and 8b2 for forming the emitter electrodes. Also in this structure, an effect similar to that of the structure in FIG. 11 can be achieved.

Referring to FIG. 13, a modification of the bipolar transistor shown in FIG. 12 will be described below. FIG. 13 is a plane showing a modification of the bipolar transistor shown in FIG. 12.

In this modification, as shown in FIG. 13, each of contact holes 8b1 and 8b2 for forming the emitter electrodes shown in FIG. 12 is longitudinally divided. Thereby, contact holes 8b11 and 8b12 as well as 8b21 and 8b22 are formed. Structures other than the above are the same as those shown in FIG. 12.

In the structure shown in FIG. 13, a sum of a length L11 of contact hole 8b11 and a length L12 of contact hole 8b12 correspond to L1 in FIG. 12, and a sum of a length L21 of contact hole 8b21 and a length L22 of contact hole 8b22 corresponds to L2 in FIG. 12.

An effect similar to those of the structures shown in FIGS. 11 and 12 can be achieved by setting L11, L12, L21, L22, S1 and S2 to values satisfying the relationship among L1, L2, S1 and S2 already described in connection with FIGS. 11 and 12. As shown in FIG. 13, the contact holes for forming the emitter electrodes are longitudinally divided, whereby a photolithographic step which is usually conducted for forming the contact holes can be conducted further easily, because the configuration is more similar to the square than those shown in FIGS. 11 and 12.

The modification shown in FIG. 13 has been described in connection with the structure in which each contact hole for forming the emitter electrode is longitudinally divided into two. However, each contact hole may be divided into three or more, provided that the emitter regions are connected to the common emitter electrode through these contact holes.

The concept shown in FIG. 13 can be applied to the devices shown in FIGS. 1, 2 and 8 to 11. Although the embodiments have been described in connection with the semiconductor device having the npn bipolar transistors or the semiconductor device having the npn bipolar transistors and the pMOS transistors, the invention can be applied to a semiconductor device including pnp bipolar transistors or a semiconductor device including pnp bipolar transistors and nMOS transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bipolar transistor comprising:

a semiconductor substrate of a first conductivity type having a main surface;

a collector region of a second conductivity type formed at the main surface of said semiconductor substrate;

a base region of the first conductivity type formed at a surface of said collector region;

an emitter region of the second conductivity type formed at a surface of said base region;

an insulating layer formed on the main surface of said semiconductor substrate, and having first, second and third openings reaching portions of the surface of said collector region, a surface of the emitter region and the surface of said base region, respectively; and a collector electrode formed in said first opening and a base electrode and a emitter electrode electrically connected to said base region through said third opening, said emitter region through said second opening, respectively wherein a concentration of impurity of the second conductivity type contained in said collector region located immediately under said base region is $5 \times 10^{18}$ cm$^{-3}$ or less, and L representing a length in a longitudinal direction of the portion of the surface of said emitter region in said second opening and S representing a width of the portion of the surface of the emitter region in said second opening in a direction perpendicular to said longitudinal direction satisfy a relationship that a value of L/S is about 9.3 or more, wherein the collector region does not comprise a high concentration buried diffusion layer of the second conductivity type.

2. The bipolar transistor according to claim 1, wherein said first, second and third openings are disposed such that said emitter electrode is located between said collector electrode and said base electrode.

3. The bipolar transistor according to claim 1, comprising a single collector electrode, a single emitter electrode and a single base electrode.

4. The bipolar transistor according to claim 1, wherein said second opening is formed of a plurality of distinct openings, each of said distinct openings reaches a portion of the same integral emitter region and is arranged along said longitudinal direction, a sum of lengths of said distinct openings in said longitudinal direction corresponds to said length L, and said emitter region is connected commonly to said emitter electrode through each of said distinct openings.

5. The bipolar transistor according to claim 1, wherein a contact portion between said collector electrode and said collector region is provided with an impurity contact region having a diffusion depth extending from the main surface substantially equal to that of said emitter region and containing impurity of the second conductivity type at a concentration substantially equal to that of impurity of the second conductivity type contained in said emitter region.

6. The bipolar transistor according to claim 1, wherein a pad conductive layer electrically connecting said emitter electrode and said emitter region together is formed in said second opening, and said emitter electrode is formed in a fourth opening reaching a portion of a surface of the pad conductive layer.

7. The semiconductor device according to claim 1, wherein the value of L/S is 10 or more.

8. A bipolar transistor comprising:

a semiconductor substrate of a first conductivity type having a main surface;

a collector region of a second conductivity type formed at the main surface of said semiconductor substrate;

a base region of the first conductivity formed at a surface of said collector region;

first and second emitter regions of the second conductivity type formed at a surface of said base region with a space from each other;

an insulating layer formed on the main surface of said semiconductor substrate, and having a first opening reaching a portion of the surface of said base region, second and third openings spaced from each other with said first opening therebetween and reaching portions of surfaces of said first and second emitter regions, respectively, and fourth and fifth openings spaced from each other with said second and third openings therebetween and reaching portions of the surface of said collector region;

a base electrode electrically connected to said base region through said first opening;

first and second emitter electrodes electrically connected to said first emitter region through said second opening, said second emitter region through said third opening, respectively; and first and second collector electrodes formed in said fourth and fifth openings, respectively; wherein a concentration of impurity of the second conductivity type contained in said collector region located immediately under said base region is $5 \times 10^{18}$ cm$^{-3}$ or less, and L1 and S1 representing a length in a longitudinal direction of the portion of the surface of said first emitter region in said second opening and a width of the portion of the surface of said first emitter region in said second opening in a direction perpendicular to said longitudinal direction, respectively, and L2 and S2 representing a length in a longitudinal direction of the portion of the surface of said second emitter region in said third opening and a width of the portion of the surface of said second emitter region in said third opening in a direction perpendicular to said longitudinal direction, respectively, satisfy a relationship that (L1/S1)+(L2/S2) is 9.3 or more.

9. The bipolar transistor according to claim 8, wherein said second opening is divided into a plurality of sixth openings, each of said sixth openings is arranged along said longitudinal direction, a sum of lengths of said sixth openings in said longitudinal direction corresponds to said length L1, and said first emitter region is connected to said first emitter electrode through each of said sixth openings, said third opening is divided into a plurality of seventh openings, each of said seventh openings is arranged along said longitudinal direction, and a sum of lengths of said seventh openings in said longitudinal direction corresponds to said length L2, and said second emitter region is connected to said second emitter electrode through each of said seventh openings.

10. The bipolar transistor according to claim 8, wherein the value of (L1/S1)+(L2/S2) is about 10 or more.

11. The bipolar transistor according to claim 8, wherein first and second pad conductive layers electrically connecting said first emitter electrode and said first emitter region together, said second emitter electrode and said second emitter region together, respectively, are formed in said second opening, third opening, respectively, and said first and second emitter electrodes are formed in a sixth opening reaching a portion of a surface of said first pad conductive layer, seventh opening reaching a portion of a surface of said second pad conductive layer, respectively.

12. A bipolar transistor comprising:

a semiconductor substrate of a first conductivity type having a main surface;

a collector region of a second conductivity type formed at the main surface of said semiconductor substrate;

first and second base regions of the first conductivity type formed at a surface of said collector region;

first and second emitter regions of the second conductivity type formed at surfaces of said first and second base regions, respectively;

an insulating layer formed on the main surface of said semiconductor substrate, and having a first opening reaching a portion of the surface of said collector region, second and third openings spaced from each other with said first opening therebetween and reaching portions of surfaces of said first and second emitter regions, respectively, and fourth and fifth openings spaced from each other with said second and third openings therebetween and reaching portions of the surfaces of said first and second base regions, respectively;

a collector electrode formed in said first opening;

first and second emitter electrodes electrically connected to said first emitter region through said second opening, said second emitter region through said third opening, respectively; and first and second base electrodes electrically connected to said first base region through said fourth opening, said second base region through said fifth opening, respectively; wherein a concentration of impurity of the second conductivity type contained in said collector region located immediately under said base region is $5 \times 10^{18} cm^{-3}$ or less, and L1 and S1 representing a length in a longitudinal direction of the portion of the surface of said first emitter region in said second opening and a width of the portion of the surface of said first emitter region in said second opening in a direction perpendicular to said longitudinal direction, respectively, and L2 and S2 representing a length in a longitudinal direction of the portion of the surface of said second emitter region in said third opening and a width of the portion of the surface of said second emitter region in said third opening in a direction perpendicular to said longitudinal direction, respectively, satisfy a relationship that (L1/S1)+(L2/S2) is 9.3 or more.

13. The bipolar transistor according to claim 12, wherein said second opening is divided into a plurality of sixth openings, each of said sixth openings is arranged along said longitudinal direction, a sum of lengths of said sixth openings in said longitudinal direction corresponds to said length L1, and said first emitter region is connected to said first emitter electrode through each of said sixth openings, said third opening is divided into a plurality of seventh openings, each of said seventh openings is arranged along said longitudinal direction, and a sum of lengths of said seventh openings in said longitudinal direction corresponds to said length L2, and said second emitter region is connected to said second emitter electrode through each of said seventh openings.

14. The bipolar transistor according to claim 12, wherein the value of (L1/S1)+(L2/S2) is about 10 or more.

15. The bipolar transistor according to claim 12, wherein first and second pad conductive layers electrically connecting said first emitter electrode and said first emitter region together, said second emitter electrode and said second emitter region together, respectively, are formed in said second opening, third opening, respectively, and said first and second emitter electrodes are formed in a sixth opening reaching a portion of a surface of said first pad conductive layer, seventh opening reaching a portion of a surface of said second pad conductive layer, respectively.

16. A semiconductor device having a bipolar transistor, and comprising:

a semiconductor substrate of a first conductivity type having a main surface;

a well region of a second conductivity type formed at the main surface of said semiconductor substrate;

an MOS transistor formed on the surface of said well region, and having source/drain regions of the first conductivity type;

a collector region spaced from said well region and formed at the main surface of said semiconductor substrate;

a base region of the first conductivity type formed at a surface of said collector region;

an emitter region of the second conductivity type formed at a surface of said base region;

an insulating layer formed on the main surface of said semiconductor substrate, and having first, second and third openings reaching portions of the surface of said collector region, a surface of the emitter region and the surface of the base region, respectively; and a collector electrode formed in said first opening and a base electrode and a emitter electrode electrically connected to said base region through said third opening, said emitter region through said second opening, respectively, wherein a concentration of impurity of the second conductivity type contained in said collector region located immediately under said base region is substantially equal to a concentration of impurity of the second conductivity type contained in said well region, and L representing a length in a longitudinal direction of the portion of the surface of said emitter region in said second opening and S representing a width of the portion of the surface of said emitter region in said second opening in a direction perpendicular to said longitudinal direction satisfy a relationship that a value of L/S is about 9.3 or more, wherein the collector region does not comprise a high concentration buried diffusion layer of the second conductivity type.

17. The semiconductor device having the bipolar transistor according to claim 16, wherein said first, second and third openings are disposed such that said emitter electrode is located between said collector electrode and said base electrode.

18. The semiconductor device having the bipolar transistor according to claim 11, wherein a contact portion between said collector electrode and said collector region is provided with an impurity contact region having a diffusion depth extending from the main surface substantially equal to that of said emitter region and containing impurity of the second conductivity type at a concentration substantially equal to that of impurity of the second conductivity type contained in said emitter region, and a contact portion between said base electrode and said base region is provided with an external base region having a diffusion depth substantially equal to that of said source/drain regions and containing impurity of the first conductivity type at a concentration substantially equal to that of impurity of the first conductivity type contained in said source/drain regions.

19. The semiconductor device according to claim 16, wherein the value of L/S is 10 or more.

20. The semiconductor device according to claim 17, wherein a pad conductive layer electrically connecting said emitter electrode and said emitter region together is formed in said second opening, and said emitter electrode is formed in a fourth opening reaching a portion of a surface of said pad conductive layer.

* * * * *